United States Patent
Han et al.

(10) Patent No.: US 11,393,888 B2
(45) Date of Patent: Jul. 19, 2022

(54) THIN FILM TRANSISTOR SUBSTRATE AND DISPLAY APPARATUS INCLUDING THE SAME

(71) Applicant: SAMSUNG DISPLAY CO., LTD., Yongin-si (KR)

(72) Inventors: Jaebum Han, Yongin-si (KR); Younggil Park, Yongin-si (KR); Junghwa Park, Yongin-si (KR); Nari Ahn, Yongin-si (KR); Sooim Jeong, Yongin-si (KR); Kinam Kim, Yongin-si (KR); Moonsung Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 105 days.

(21) Appl. No.: 16/898,684

(22) Filed: Jun. 11, 2020

(65) Prior Publication Data

US 2020/0395426 A1 Dec. 17, 2020

(30) Foreign Application Priority Data

Jun. 13, 2019 (KR) ........................ 10-2019-0070067

(51) Int. Cl.
*H01L 27/32* (2006.01)
*H01L 29/786* (2006.01)
*H01L 27/12* (2006.01)

(52) U.S. Cl.
CPC ...... *H01L 27/3262* (2013.01); *H01L 27/3258* (2013.01); *H01L 27/3272* (2013.01); *H01L 27/1225* (2013.01); *H01L 27/1248* (2013.01); *H01L 29/7869* (2013.01); *H01L 29/78633* (2013.01); *H01L 29/78675* (2013.01)

(58) Field of Classification Search
CPC .................................................. H01L 27/3258
See application file for complete search history.

(56) References Cited

U.S. PATENT DOCUMENTS

| 8,981,359 B2 | 3/2015 | Kum et al. |
| 9,324,743 B2 | 4/2016 | Jung et al. |
| 9,818,814 B2 | 11/2017 | Park et al. |

(Continued)

FOREIGN PATENT DOCUMENTS

| KR | 10-2016-0130018 | 11/2016 |
| KR | 10-2018-0024817 | 3/2018 |

(Continued)

*Primary Examiner* — Victoria K. Hall
(74) *Attorney, Agent, or Firm* — F. Chau & Associates, LLC

(57) ABSTRACT

A thin film transistor substrate includes a first semiconductor layer disposed on a substrate and having a first channel area, a first source area and a first drain area. A first gate electrode is disposed above the first semiconductor layer and overlaps the first channel area. A first electrode layer is disposed above the first gate electrode and electrically connects to at least one of the first source area and the first drain area. A second insulating layer is disposed between the first gate electrode and the first electrode layer. The second insulating layer includes an inorganic control layer and a first inorganic layer arranged on the inorganic control layer. The inorganic control layer has a lower density than a density of the first inorganic layer.

19 Claims, 9 Drawing Sheets

(56) References Cited

U.S. PATENT DOCUMENTS

| | | | |
|---|---|---|---|
| 9,985,082 B2* | 5/2018 | Lee | H01L 27/1248 |
| 10,297,622 B2* | 5/2019 | Na | H01L 29/42384 |
| 10,748,938 B2* | 8/2020 | Zhou | H01L 27/1296 |
| 11,063,068 B2* | 7/2021 | Jeon | H01L 27/1248 |
| 2002/0113248 A1* | 8/2002 | Yamagata | H01L 51/5203 |
| | | | 257/187 |
| 2003/0059986 A1* | 3/2003 | Shibata | H01L 29/78696 |
| | | | 438/149 |
| 2003/0124863 A1* | 7/2003 | Hwang | H01L 21/0217 |
| | | | 438/694 |
| 2006/0068532 A1* | 3/2006 | Schuele | G09G 3/20 |
| | | | 438/149 |
| 2009/0050884 A1* | 2/2009 | Ye | H01L 29/7869 |
| | | | 257/43 |
| 2012/0193714 A1* | 8/2012 | Okihara | H01L 21/76254 |
| | | | 257/347 |
| 2013/0026603 A1* | 1/2013 | Wang | H01L 28/65 |
| | | | 257/532 |
| 2013/0267068 A1* | 10/2013 | Hanaoka | H01L 27/1156 |
| | | | 438/149 |
| 2014/0284594 A1* | 9/2014 | Nakano | H01L 29/7869 |
| | | | 257/43 |
| 2015/0194475 A1* | 7/2015 | Kawashima | H01L 21/02178 |
| | | | 257/40 |
| 2016/0141425 A1* | 5/2016 | Sun | H01L 29/41733 |
| | | | 257/72 |
| 2017/0229554 A1* | 8/2017 | Choi | H01L 27/1222 |
| 2017/0358688 A1* | 12/2017 | Lee | H01L 29/78618 |
| 2018/0012947 A1* | 1/2018 | Lee | H01L 27/1225 |
| 2018/0053917 A1* | 2/2018 | Isaka | G09G 3/3225 |
| 2018/0061868 A1* | 3/2018 | Na | H01L 27/1225 |
| 2018/0145118 A1 | 5/2018 | Kim et al. | |
| 2018/0151114 A1 | 5/2018 | Choi et al. | |
| 2018/0151834 A1* | 5/2018 | Kanaya | H01L 27/3262 |
| 2018/0158890 A1* | 6/2018 | Chang | H01L 27/1225 |
| 2018/0301565 A1* | 10/2018 | Liu | H01L 29/78627 |
| 2019/0043934 A1* | 2/2019 | Ukigaya | G09G 3/3225 |
| 2019/0073509 A1* | 3/2019 | Chien | G02F 1/133553 |
| 2019/0096971 A1* | 3/2019 | Ukigaya | H01L 51/5012 |
| 2020/0303425 A1* | 9/2020 | Hara | H01L 21/02565 |
| 2021/0134915 A1* | 5/2021 | He | H01L 27/3258 |
| 2021/0183990 A1* | 6/2021 | Ikeda | H01L 27/326 |
| 2021/0288082 A1* | 9/2021 | Zhang | H01L 27/1214 |
| 2021/0327987 A1* | 10/2021 | Fang | H01L 51/56 |
| 2021/0375952 A1* | 12/2021 | Tian | H01L 29/4908 |
| 2022/0005901 A1* | 1/2022 | Tanaka | H01L 29/78696 |
| 2022/0006059 A1* | 1/2022 | Kim | H01L 27/3244 |
| 2022/0045148 A1* | 2/2022 | Kim | H01L 27/3258 |

FOREIGN PATENT DOCUMENTS

| | | |
|---|---|---|
| KR | 10-2018-0056446 | 5/2018 |
| KR | 10-2018-0062148 | 6/2018 |
| KR | 10-2018-0064600 | 6/2018 |

* cited by examiner

THIN FILM TRANSISTOR SUBSTRATE AND DISPLAY APPARATUS INCLUDING THE SAME

CROSS-REFERENCE TO RELATED APPLICATION

This application claims priority under 35 § 119 to Korean Patent Application No. 10-2019-0070067, filed on Jun. 13, 2019, in the Korean Intellectual Property Office, the disclosure of which is incorporated by reference in its entirety herein.

1. Technical Field

One or more exemplary embodiments relate to a thin film transistor substrate and a display apparatus including the thin film transistor substrate, and more particularly, to a thin film transistor substrate in which characteristics of a circuit including a thin film transistor are improved, and a display apparatus including the thin film transistor substrate.

2. Discussion of Related Art

There has been rapid development concerning display apparatuses that are configured to display various electrical signal information. For example, a variety of display apparatuses having excellent characteristics such as a small thickness, a light weight, and low power consumption have been introduced. Organic light-emitting display apparatuses may provide a wide viewing angle, a high contrast and a high response speed. Therefore, organic light-emitting display apparatuses have garnered attention as a next-generation display apparatus.

Such display apparatuses may include a thin film transistor, a capacitor, or the like as driving circuits. A thin film transistor may include an active layer including a channel area, a source area, and a drain area and a gate electrode electrically connected to the active layer via a gate insulating layer. An active layer of a thin film transistor may typically be formed of amorphous silicon or poly-silicon.

SUMMARY

In a thin film transistor, when an active layer is formed of amorphous silicon, charge mobility is low and thus it may be difficult to implement a fast-operating driving circuit. When an active layer is formed of poly-silicon, charge mobility may be increased, but a threshold voltage Vth of a thin film transistor may be non-uniform and thus an additional compensation circuit is to be added.

One or more exemplary embodiments provide a thin film transistor substrate in which characteristics of a circuit including a thin film transistor are improved and a display apparatus including the thin film transistor substrate. However, the above objective is exemplary, and the scope of the present disclosure is not limited thereto.

Additional aspects will be set forth in part in the description which follows and, in part, will be apparent from the description, or may be learned by practice of the exemplary embodiments of the disclosure.

According to one or more exemplary embodiments, a thin film transistor substrate includes a first semiconductor layer disposed on a substrate and having a first channel area, a first source area and a first drain area. A first gate electrode is disposed above the first semiconductor layer and overlaps the first channel area. A first electrode layer is disposed above the first gate electrode and electrically connects to at least one of the first source area and the first drain area. A second insulating layer is disposed between the first Late electrode and the first electrode layer. The second insulating layer includes an inorganic control layer and a first inorganic layer arranged on the inorganic control layer. The inorganic control layer has a lower density than a density of die first inorganic layer.

According to an exemplary embodiment, the thin film transistor substrate may further include a gate insulating layer between the first semiconductor layer and the first gate electrode. The gate insulating layer is patterned to correspond to the first channel area.

According to an exemplary embodiment, the gate insulating layer may overlap the first channel area and expose the first source area and the first drain area, and the second insulating layer may directly contact the first source area and the first drain area.

According to an exemplary embodiment, the first semiconductor layer may include an oxide semiconductor material.

According to an exemplary embodiment, the thin film transistor substrate may further include a second semiconductor layer arranged on the substrate, a second gate electrode overlapping the second semiconductor layer and a second electrode layer located above the second gate electrode and electrically connected to the second semiconductor layer. The second semiconductor layer includes low-temperature poly-silicon (LTPS).

According to an exemplary embodiment, the second gate electrode may include a lower gate electrode and an upper gate electrode.

According to an exemplary embodiment, the thin film transistor substrate may farther include a light-blocking layer between the substrate and the first semiconductor layer.

According to an exemplary embodiment, the light-blocking layer may include a same material as that of the second gate electrode.

According to an exemplary embodiment, the first insulating layer may be between the light-blocking layer and the first semiconductor layer.

According to an exemplary embodiment, the first insulating layer and the second insulating layer may be between the second gate electrode and the second electrode layer.

According torn exemplary embodiment, the thin film transistor substrate may further include a second inorganic layer between the first semiconductor layer and the inorganic control layer, and the first inorganic layer may include silicon nitride ($SiN_x$), and the second inorganic layer may include silicon oxide ($SiO_x$).

According to an exemplary embodiment, the inorganic control layer may include at least one of silicon nitride ($SiN_x$), silicon oxide ($SiO_x$), and silicon oxynitride (SiON).

According to an exemplary embodiment, the inorganic control layer may include silicon oxide ($SiO_x$) having hydrogen (H) of a higher concentration than the second inorganic layer.

According to an exemplary embodiment, the inorganic control layer may include silicon nitride ($SiN_x$) having a higher oxygen (O) ratio and a lower nitrogen (N) ratio than the first inorganic layer.

According to an exemplary embodiment, the first inorganic layer may include silicon oxynitride (SiON), and the inorganic control layer may include an inorganic material having higher oxygen (O) ratio and a lower nitrogen (N) ratio than the first inorganic layer.

According to an exemplary embodiment, the inorganic control layer may include silicon oxynitride (SiON) or silicon oxide ($SiO_x$).

According to one or more exemplary embodiments, a first thin film transistor is disposed on the substrate and comprises a first semiconductor layer including an oxide semiconductor material, a first gate electrode overlapping the first semiconductor layer, and a first electrode layer disposed on the first gate electrode and electrically connected to the first semiconductor layer. A second thin film transistor is arranged on the substrate and comprises a second semiconductor layer including low-temperature poly-silicon (LTPS), a second gate electrode overlapping the second semiconductor layer, and a second electrode layer disposed on the second gate electrode and electrically connected to the second semiconductor layer. An insulating layer is disposed between the first gate electrode and the first electrode layer and comprises a first inorganic layer and an inorganic control layer. The inorganic control layer is configured to absorb moisture diffused from the first inorganic layer.

According to an exemplary embodiment, the thin film transistor substrate may further include a gate insulating layer between the first semiconductor layer and the first gate electrode. The gate insulating layer is patterned to correspond only to a channel area of the first semiconductor layer.

According to an exemplary embodiment, the thin film transistor substrate may further include a light-blocking layer between the substrate and the first semiconductor layer. The light-blocking layer includes a same material as that of the second gate electrode.

According to one or more exemplary embodiments, a display apparatus includes a first semiconductor layer disposed on a substrate and comprising a first channel area, a first source area and a first drain area. A first gate electrode is disposed above the first semiconductor layer and overlaps the first channel area. A first electrode layer is located above the first gate electrode and electrically connects to at least one of the first source area and the first drain area. A second insulating layer is disposed between the first gate electrode and the first electrode layer. The second insulating layer comprises an inorganic control layer and a first inorganic layer arranged on the inorganic control layer. The inorganic control layer has a lower density than a density of the first inorganic layer. A light-emitting device is disposed above the second insulating layer and comprises a pixel electrode, an opposite electrode on the pixel electrode, and an intermediate layer disposed between the pixel electrode and the opposite electrode.

In addition to the aforesaid details, other aspects, features, and advantages will be clarified from the following detailed description, claims, and drawings.

These general and specific embodiments may be implemented by using a system, a method, a computer program, or a combination of the system, the method, and the computer program.

BRIEF DESCRIPTION OF THE DRAWINGS

The above and other aspects, features, and advantages of certain exemplary embodiments of the present inventive concepts will be more apparent from the following description taken in conjunction with the accompanying drawings, in which.

DETAILED DESCRIPTION OF THE EXEMPLARY EMBODIMENTS

Figure 1:
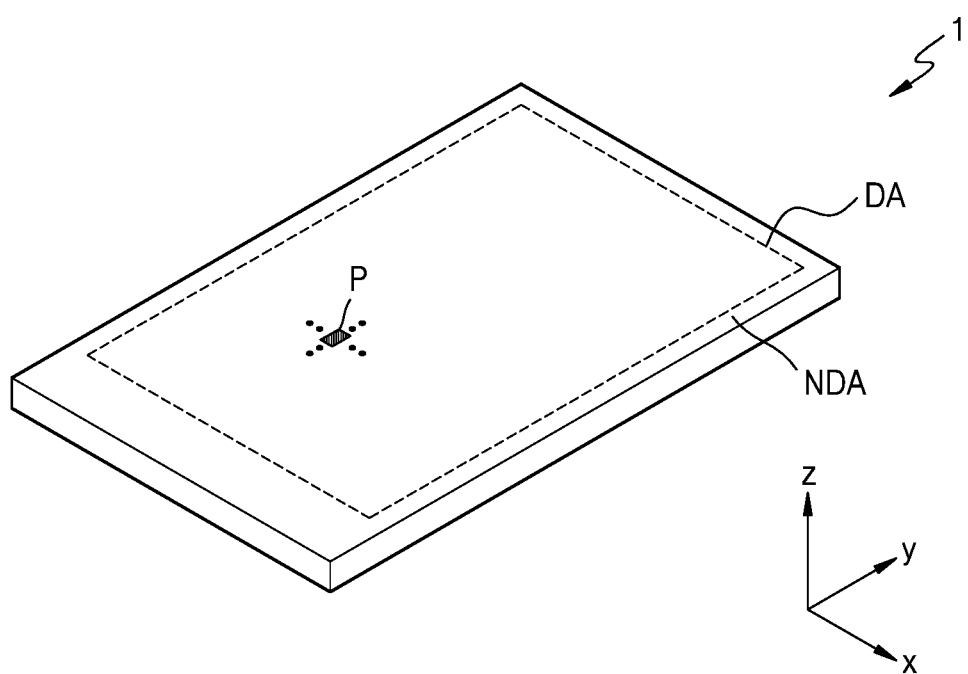
FIG. 1 is a perspective view of a display apparatus according to an exemplary embodiment of the present inventive concepts.

Reference will now be made in detail to embodiments, examples of which are illustrated in the accompanying drawings, wherein like reference numerals refer to like elements throughout. In this regard, the present embodiments may have different forms and should not be construed as being limited to the descriptions of the exemplary embodiments set forth herein. Accordingly, the exemplary embodiments are merely described below, by referring to the figures, to explain aspects of the present inventive concepts. As used herein, the term "and/or" includes any and all combinations of one or more of the associated listed items. Expressions such as "at least one of", when preceding a list of elements, modify the entire list of elements and do not modify the individual elements of the list.

Hereinafter, the present inventive concepts will be described more fully with reference to the accompanying drawings, in which exemplary embodiments of the present disclosure are shown. In the drawings, like elements are labeled like reference numerals and repeated description thereof will be omitted.

While such terms as "first," "second" etc., may be used to describe various components, such components are not be limited to the above terms. The above terms are used only to distinguish one component from another. An expression used in the singular encompasses the expression of the plural, unless it has a clearly different meaning in the context.

In the present specification, it is to be understood that terms such as "including" or "having" are intended to indicate the existence of the features or components disclosed in the specification, and are not intended to preclude the possibility that one or more other features or components may be added. Also, it will be understood that when a layer, region, or component is referred to as being "above" or "on" another layer, region, or component, it may be "directly or indirectly above" or "directly or indirectly on" the other layer, region, or component. For example, intervening layers, regions, or components may be present.

The sizes of components in the drawings may be exaggerated or contracted for convenience of explanation. Since the sizes and thicknesses of components in the drawings are arbitrarily illustrated for convenience of explanation, the following exemplary embodiments are not limited thereto.

An x-axis, a y-axis, and a z-axis are not limited to three axes on a rectangular coordinates system but may be construed as including these axes. For example, an x-axis, a y-axis, and a z-axis may be at right angles or may also indicate different directions from one another, which are not at right angles.

When a certain exemplary embodiment may be implemented differently, a specific process order may be performed differently from the described order. For example, two consecutively described processes may be performed substantially at the same time or performed in an order opposite to the described order.

FIG. 1 is a perspective view of a display apparatus 1 according to an exemplary embodiment of the present inventive concepts.

Referring to FIG. 1, the display apparatus 1 includes a display area DA in which an image is displayed and a non-display area NDA in which no images are displayed. The display apparatus 1 may provide an image by using light emitted from a plurality of pixels P arranged in the display area DA.

Hereinafter, an organic light-emitting display apparatus will be described as an example of the display apparatus 1 according to an exemplary embodiment. However exemplary embodiments of the present inventive concepts are not limited thereto. For example, in other exemplary embodiments, the display apparatus may be various types of display apparatuses such as an inorganic electroluminescent (EL) display (inorganic light-emitting display), a quantum dot light-emitting display, etc.

FIG. 1 illustrates the display apparatus 1 in which the display area DA is quadrangular. For example, the display apparatus 1 shown in the exemplary embodiment has a rectangular shape. The non-display area NDA surrounds the display area DA in the X and/or Y directions. However, exemplary embodiments of the present inventive concepts are not limited thereto. For example, in other exemplary embodiments, the display area DA may have circular, oval, or a polygonal Shape, such as a triangle or a pentagon, in addition, the display apparatus 1 shown in the exemplary embodiment of FIG. 1 is a flat planar display apparatus. However, the display apparatus 1 may also be in various forms such as a flexible, foldable or reliable display apparatus.

Figure 2:
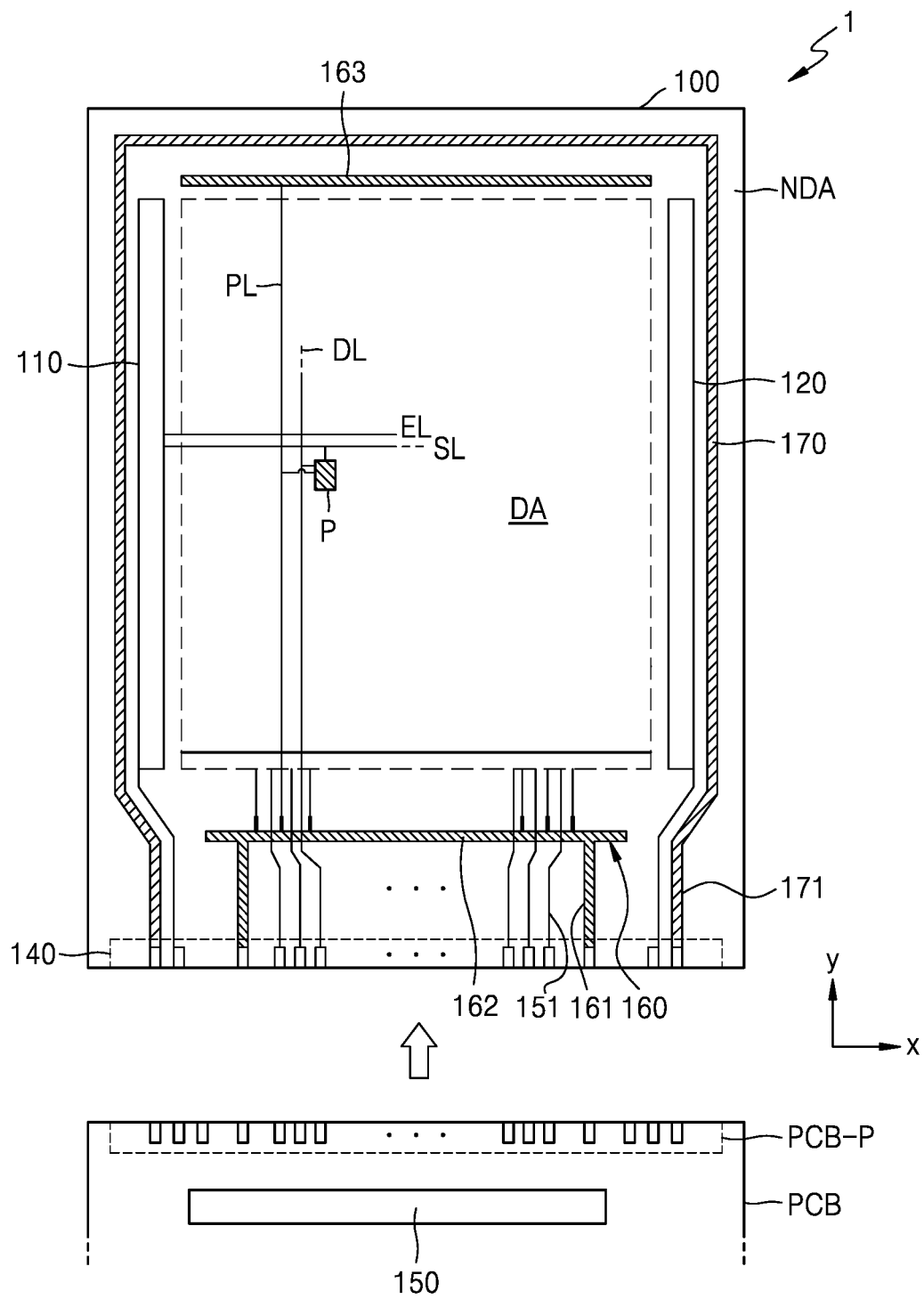
FIG. 2 is a top plan view of a display apparatus according to an exemplary embodiment of the present inventive concepts.

FIG. 2 is a plan view of a display apparatus 1 according to an exemplary embodiment of the present inventive concepts.

Referring to FIG. 2, the display apparatus 1 includes a plurality of pixels P arranged in a display area DA. Each of the pixels P may include a display element such as an organic light-emitting device (OLED). Each pixel P may emit red light, green light, blue light, or white light from the organic light-emitting device OLED. However, exemplary embodiments of the present inventive concepts are not limited thereto. The display area DA may be covered by an encapsulation member to be protected from external air or moisture.

Each pixel P may be electrically connected to external circuits arranged in a non-display area NDA. In the non-display area NDA, a first scan driving circuit 110, a second scan driving circuit 120, a terminal 140, a data driving circuit 150, a first power supply line 60, and a second power supply hue 170 may be arranged.

The first scan driving circuit 110 may provide a scan signal to each pixel P via a scan line SL. The first scan driving circuit 110 may provide an emission control signal to each pixel P via an emission control line. The second scan driving circuit 120 may be arranged in parallel to the first scan driving circuit 110 with the display area DA therebetween. Some of the pixels P arranged in the display area DA may be electrically connected to the first scan driving circuit 110, and the rest of the pixels P may be electrically connected to the second scan driving circuit 120. According to another exemplary embodiment, the second scan driving circuit 120 may be omitted. Furthermore, in other exemplary embodiments, the numbers and arrangements of the external circuits arranged in the non-display area NDA may vary.

The terminal 140 may be arranged at a side of a substrate 100. For example, as shown in the exemplary embodiment of FIG. 2, the terminal 140 may be arranged on a bottom side (e.g., in the Y direction) of the substrate. The terminal 140 may not be covered by an insulating layer and is exposed and electrically connected to a printed circuit board PCB. A terminal PCB-P of the printed circuit board PCB may be electrically connected to the terminal 140 of the display apparatus 1. In an exemplary embodiment, the printed circuit board PCB transfers a signal of a controller or power to the display apparatus 1.

A control signal generated in the controller may be transferred to each of the first and second scan driving circuits 110 and 120 via the printed circuit board PCB. The controller may provide first and second power voltages ELVDD and ELVSS (as explained in more detail in the exemplary embodiments of FIGS. 5 and 6 described later) to the first and second power supply lines 160 and 170 via first and second connection lines 161 and 171, respectively. The first power voltage ELVDD may be provided to each pixel P via a driving voltage line PL connected to the first power supply line 160, and the second power voltage ELVSS may be provided to an opposite electrode of each pixel P connected to the second power supply line 170.

The data driving circuit 150 is electrically connected to a data line DL. A data signal of the data driving circuit 150 may be provided to each pixel P via a connection line 15 connected to the terminal 140 and the data line DL connected to the connection line 151. FIG. 2 illustrates the data driving circuit 150 arranged in the printed circuit board PCB. However, according to another exemplary embodiment, the data driving circuit 150 may also be arranged on the substrate 100. For example, the data driving circuit 150 may be arranged between the terminal 140 and the first power supply line 160.

The first power supply line 160 may include a first sub line 162 and a second sub-line 163 that extend in parallel to each other in the X direction with the display area DA therebetween. The second power supply line 170 may have a loop shape or a rectangular shape having one side open and partially surround the display area DA. For example, the second power supply line 170 may hay three sides that are substantially the same shape as the display apparatus 1 and may be uniformly spaced apart from adjacent edges of the display apparatus. However, exemplary embodiments of the present inventive concepts are not limited thereto and the first power supply line 160 and second power supply line 170 may have various other configurations and arrangements.

Figure 3:
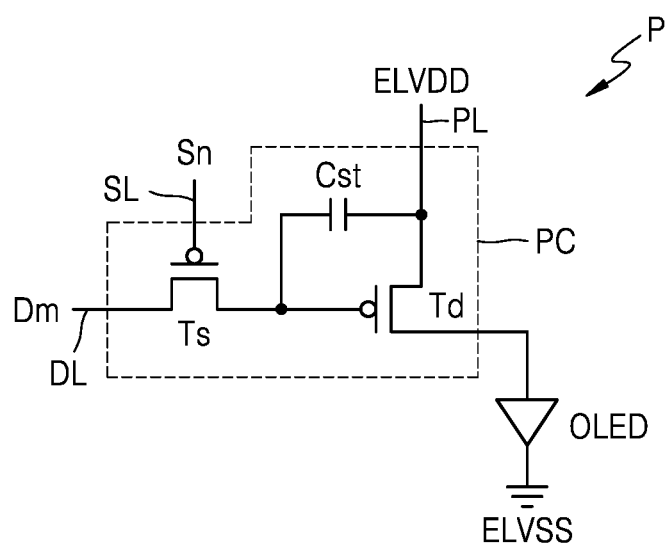
FIG. 3 is an equivalent circuit diagram of a pixel that may be included in a display apparatus, according to an exemplary embodiment of the present inventive concepts.

FIG. 3 is an equivalent circuit diagram of a pixel that may be included in a display apparatus, according to an exemplary embodiment of the present inventive concepts.

Referring to FIG. 3, each pixel P may include a pixel circuit PC connected to a scan line SL and a data line DL and an organic light-emitting device OLED connected to the pixel circuit PC.

In an exemplary embodiment, the pixel circuit PC includes a driving thin film transistor Td, a switching thin film transistor Ts, and a storage capacitor Cst. The switching thin film transistor Ts is connected to the scan line SL and the data line DL and transfers a data signal Dm input via the data line DL, to the driving thin film transistor Td according to a scan signal Sn input via the scan line SL.

The storage capacitor Cst is connected to the switching thin film transistor Ts and the driving voltage lite PL and stores a voltage corresponding to a difference between a voltage received from the switching thin film transistor Ts and the first power voltage ELVDD (or driving voltage) supplied to the driving voltage line PL.

The driving thin film transistor Td is connected to the driving voltage line PL and the storage capacitor Cst and may control, in accordance with a voltage value stored in the storage capacitor Cst, a driving current flowing from the driving voltage line PL through the organic light-emitting device OLED. The organic light-emitting device OLED may emit light having a certain brightness based on the driving current.

Although, the exemplary embodiment of the pixel circuit PC shown in FIG. 3 includes two thin film transistors and one storage capacitor, exemplary embodiments of the present inventive concepts are not limited thereto. For example, as illustrated in the exemplary embodiment of FIG. 8, the pixel circuit PC may include seven thin film transistors and one storage capacitor. According to another exemplary embodiment, the pixel circuit PC may include two or more storage capacitors.

Figure 4:
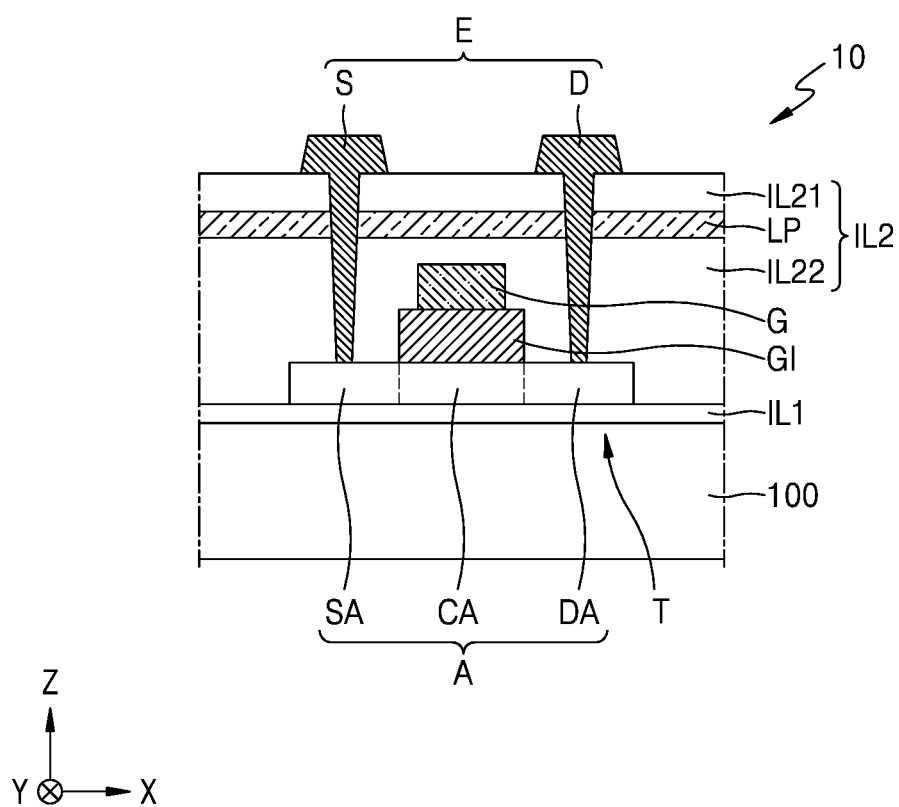
FIGS. 4 through 6 are cross-sectional views illustrating a thin film transistor substrate included in a display apparatus, according to exemplary embodiments of the present inventive concepts.
Figure 5:
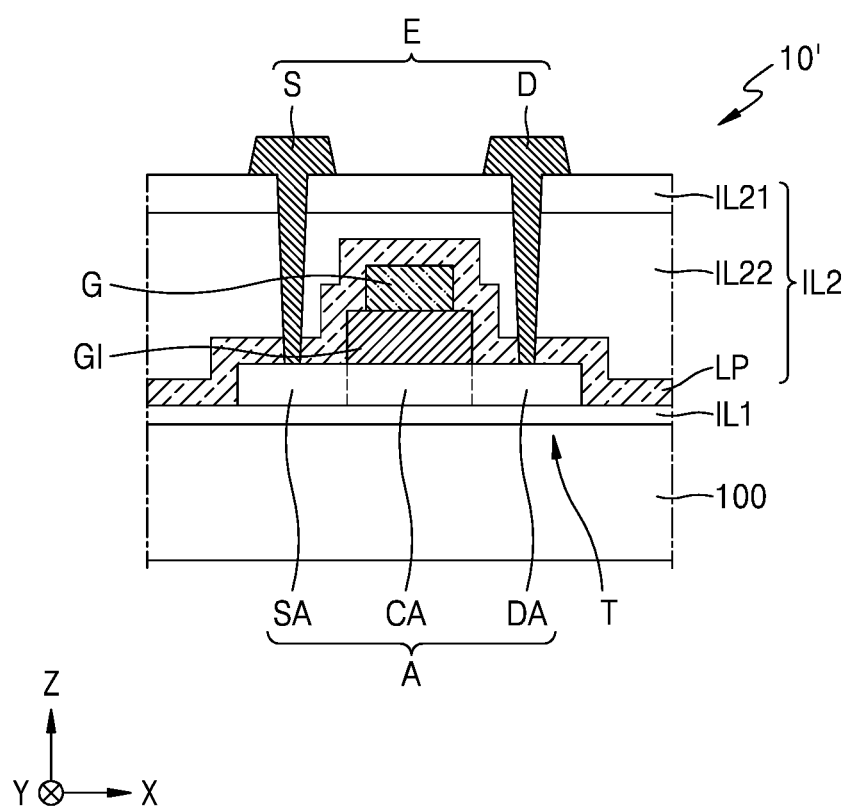
Figure 6:
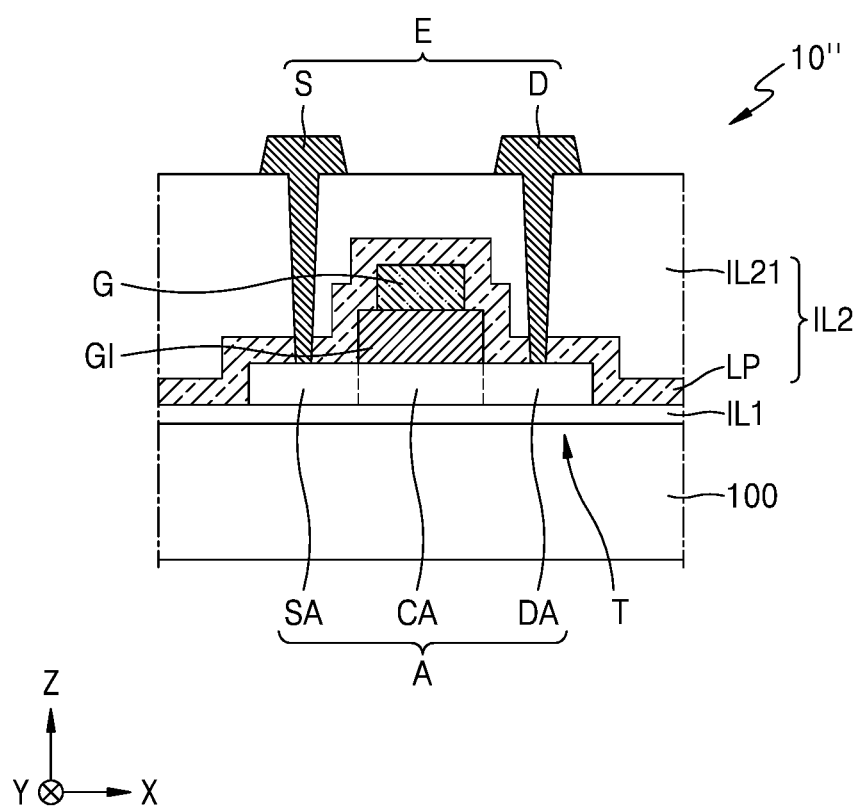

FIGS. 4 through 6 are schematic cross-sectional views illustrating thin film transistor substrates 10, 10', and 10" included in a display apparatus according to exemplary embodiments of the present inventive concepts. FIGS. 5 and 6 illustrate modified examples of a thin film transistor T of FIG. 4.

Referring to FIG. 4, the thin film transistor T may be located above the substrate 100 (e.g., in the Z direction). In an exemplary embodiment, the thin film transistor T may be disposed directly on the substrate 100 (e.g., in the Z direction). Alternatively, as shown in the exemplary embodiment of FIG. 4, the first insulating layer IL1 may be disposed directly on the substrate 100 (e.g., in the Z direction) and the thin film transistor T may be disposed directly on the first insulating layer IL1. Although the first insulating layer IL1 is illustrated as a single layer in FIG. 4, in some exemplary embodiments the first insulating layer IL1 may also be a multi-layer. For example, the first insulating layer IL1 may include a multi-layer including silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc.

The thin film transistor T may include a semiconductor layer A, a gate electrode G arranged to partially overlap the semiconductor layer A (e.g., in the Z direction), and an electrode layer E electrically connected to the semiconductor layer A. While a top gate-type thin film transistor T in which the gate electrode G is located above the semiconductor layer A (e.g., in the Z direction) is shown in the exemplary embodiment of FIG. 4, in other exemplary embodiments of the present inventive concepts, the thin film transistor T may be a bottom gate-type thin film transistor T in which the gate electrode G is located below the semiconductor layer A (e.g., in the Z direction).

The semiconductor layer A may include an oxide semiconductor. For example, in an exemplary embodiment, the semiconductor layer A may include an oxide of at least one material selected from indium (In), gallium (Ga), tin (Sn), zirconium (Zr), vanadium (N), hafnium (Hf), cadmium (Cd), germanium (Ge), chromium (Cr), titanium (Ti), and zinc (Zn). For example, the semiconductor layer A may be an InSnZnO (ITZO) semiconductor layer, an InGaZnO (IGZO) semiconductor layer, etc. However, exemplary embodiments of the present inventive concepts are not limited thereto.

The semiconductor layer A may include a channel area CA and a source area SA and a drain area DA that are respectively arranged at opposite ends of the channel area CA (e.g., in the X direction) with the channel area CA disposed therebetween. The source area SA and the drain area DA may each be an area having a greater electrical conductivity than the channel area CA. In an exemplary embodiment, the source area SA and the drain area DA may have a greater electrical conductivity than the channel area CA due to a conductivity imparting process performed by, for example, plasma processing or impurity doping.

A gate insulating layer GI is arranged on the semiconductor layer A. For example, the gate insulating layer GI may be disposed directly on the semiconductor layer A (e.g., in the Z direction). The gate insulating layer GI is patterned to overlap a portion of the semiconductor layer A (e.g., in the Z direction). An overlapping area between the gate insulating layer GI and the semiconductor layer A may be the channel area CA. As described above, the source area SA and the drain area DA undergo a conductivity imparting process performed by, for example, plasma processing or impurity doping. A portion of the semiconductor layer A overlapping the gate insulating layer GI is not exposed to the plasma processing or impurity doping processes and thus has different properties from the properties of the source area SA and the drain area DA. For example, when performing plasma processing or impurity doping on the semiconductor layer A, the gate insulating layer GI may be used as a self-alignment mask to form a channel area CA in which an overlapping portion thereof (e.g., in the Z direction) with the gate insulating layer GI is not doped with an impurity and to form, on both sides of the channel area CA (e.g., in the X direction), the source area SA and the drain area DA each doped with impurities.

The gate electrode G may be located on the gate insulating layer GI. For example, as shown in the exemplary embodiment of FIG. 4, the gate electrode G may be disposed directly on the gate insulating layer GI (e.g., in the Z direction). In an exemplary embodiment, the gate electrode G may include a single-layer or multi-layer structure including one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode G may be connected to a gate line via which an electrical signal is applied to the gate electrode G. According to an exemplary embodiment of the present inventive concepts, after the source area SA and the drain area DA are doped with impurities using the gate insulating layer GI as a mask, the gate insulating layer GI may be patterned by using the gate electrode G as a mask. After the patterning process, the gate insulating layer GI may have a substantially identical shape to that of the gate electrode G. For example, the width of the gate insulating layer (e.g., the length of the gate insulating layer in the X direction) may be the same as a width of the gate electrode G.

The thin film transistor T may include a second insulating layer IL2 covering the gate electrode G and the source area SA and the drain area DA and include an electrode layer E arranged on the second insulating layer IL2. For example, as shown in FIG. 4, the electrode layer E may be disposed directly on the second insulating layer IL2 (e.g., in the Z direction). In exemplary embodiments having a gate line that applies an electrical signal to the gate electrode G which is formed as a single body with the gate electrode G, the second insulating layer IL2 may also cover the gate line.

The electrode layer E may include a source electrode S electrically connected to the source area SA and a drain electrode D electrically connected to the drain area DA. For example, as shown in the exemplary embodiment of FIG. 4, the source electrode S and the drain electrode D may be electrically connected to the source area SA and drain area D through contact holes that extend through the second insulating layer IL2.

In an exemplary embodiment, the electrode layer E may include a single-layer or multi-layer structure including one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). However, exemplary embodiments of the present inventive concepts are not limited thereto. According to an exemplary embodiment, the electrode layer E may be a single layer including Mo or a multi-layer including Mo/Al/Mo. The electrode layer E may be connected to the data line DL and/or the driving voltage line PL.

The second insulating layer IL2 may be disposed between the gate electrode G and the electrode layer E (e.g., in the Z direction). In the exemplary embodiment shown in FIG. 4, the second insulating layer IL2 may have a multi-layer structure. The second insulating layer IL2 may include a first inorganic layer IL21, a second inorganic layer IL22, and an inorganic control layer LP disposed between the first inorganic layer IL21 and the second inorganic layer IL22. For example, as shown in the exemplary embodiment of FIG. 4, a bottom surface of the inorganic control layer LP may be disposed directly on a top surface of the second inorganic layer IL22 (e.g., in the Z direction). A bottom surface of the first inorganic layer IL21 may be disposed directly on a top surface of the inorganic control layer LP (e.g., in the Z direction).

According to an exemplary embodiment of the present inventive concepts, the inorganic control layer LP may be about 2000 Å or less. For example, the inorganic control layer LP may be about 1500 Å or less. In another exemplary embodiment, the inorganic control layer LP may be about 1000 Å or less.

In an exemplary embodiment, the first inorganic layer IL21, the second inorganic layer IL22, and the inorganic control layer LP may each include a single layer or multi-layer including silicon oxide ($SiO_x$), silicon nitride ($SiN_x$), oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc. However, exemplary embodiments of the present inventive concepts are not limited thereto. According to an exemplary embodiment, the first inorganic layer IL21 in an upper portion (e.g., in the Z direction) may include silicon nitride ($SiN_x$), and the second inorganic layer IL22 in a lower portion may include silicon oxide ($SiO_x$).

According to another exemplary embodiment shown in FIG. 5, the second insulating layer IL2 may include the first inorganic layer IL21, the second inorganic layer IL22, and the inorganic control layer LP. The first inorganic layer IL21 and the second inorganic layer IL22 may be disposed on the inorganic control layer LP. For example, the inorganic control layer LP may be arranged to cover the gate electrode G and the source area SA and the drain area DA, and the second inorganic layer IL22 and the first inorganic layer IL21 may be sequentially stacked on the inorganic control layer LP. A bottom surface of the second inorganic layer IL22 may be disposed directly on a top surface of the inorganic control layer LP (e.g., in the Z direction). A bottom surface of the first inorganic layer IL21 may be disposed directly on a top surface of the second inorganic layer IL22 (e.g., in the Z direction). As shown in the exemplary embodiment of FIG. 5, the electrode layer E may be electrically connected to the semiconductor layer via a contact hole defined in the second inorganic layer IL22, the inorganic control layer LP and the first inorganic layer IL21. According to an exemplary embodiment, an upper portion of the first inorganic layer IL21 may include silicon nitride ($SiN_x$) and a lower portion of the second inorganic layer IL22 may include silicon oxide ($SiO_x$).

According to another exemplary embodiment shown in FIG. 6, the second insulating layer IL2 may include the first inorganic layer IL21 and the inorganic control layer LP. The inorganic control layer LP may be arranged to cover the gate electrode G and the source area SA and the drain area DA. The first inorganic layer IL21 may be arranged on the inorganic control layer LP. For example, a bottom surface of the first inorganic layer IL21 may be disposed directly on a top surface of the inorganic control layer LP (e.g., in the Z direction). According to an exemplary embodiment, the first inorganic layer IL21 arranged on the inorganic control layer LP may include silicon oxynitride (SiON).

Referring back to FIG. 4, the inorganic control layer LP may have a lower density than the first inorganic layer IL21 and the second inorganic layer IL22. For example, the material of the inorganic control layer LP may be less dense than materials of the first inorganic layer IL21 and the second inorganic layer IL22.

According to an exemplary embodiment, the first inorganic layer IL21, the second inorganic layer IL22, and the inorganic control layer LP may be formed using a plasma-enhanced chemical vapor deposition (PECVD) method. In the PECVD method, a density of an inorganic layer being formed may be controlled by adjusting the power (RF power) used to generate plasma. As described above, in order for the inorganic control layer LP to have a lower density than the first inorganic layer IL21 and the second inorganic layer IL22, when forming a plasma layer, power used to form the inorganic control layer LP is set to be lower than power used to form the first inorganic layer IL21 and the second inorganic layer IL22. Accordingly, the inorganic control layer LP having a relatively low density is formed.

For example, when the inorganic control layer LP is formed of silicon oxide ($SiO_x$), the inorganic control layer LP formed using low-power plasma may have a relatively high concentration of hydrogen (H) compared to a silicon oxide layer formed using high-power plasma.

For example, when the inorganic control layer LP is formed of silicon oxynitride (SiON), the inorganic control layer formed using low-power plasma may include more oxygen (O) and simultaneously less nitrogen (N) compared to a silicon oxynitride layer formed using high-power plasma. The inorganic control layer LP may have a similar composition ratio to that of a silicon oxide layer.

According to another exemplary embodiment, when the inorganic control layer LP is formed of silicon nitride (SiNx), the inorganic control layer LP formed using low-power plasma may include more oxygen (O) and simultaneously less nitrogen (N) compared to a silicon nitride layer formed using high-power plasma. For example, the inorganic control layer LP may have a similar composition ratio to that of a silicon oxynitride layer.

The thin film transistor T according to an exemplary embodiment includes the gate insulating layer GI patterned to correspond to the channel area CA. The gate insulating layer GI overlaps the channel area CA (e.g., in the Z direction) but exposes the source area SA and the drain area DA. The source area SA and the drain area DA may directly contact the second insulating layer IL2 formed on the gate electrode G. Accordingly, the source area SA and the drain area DA are directly exposed to hydrogen and oxygen that are diffused from the second insulating layer IL2. Moreover, as a display apparatus has an increasingly high resolution, the pixel P (FIG. 3) and the pixel circuit PC (FIG. 3) also gradually reduce in size. Therefore, the display apparatus is more affected by hydrogen and oxygen introduced into the semiconductor layer A. The introduction of hydrogen and oxygen as described above reduces oxygen vacancy in the semiconductor layer A and increases device characteristics, such as a distribution of a threshold voltage Vth, thus making it difficult to control the thin film transistor T.

In an exemplary embodiment of the present inventive concepts, the inorganic control layer LP is in the second insulating layer IL2. Therefore, diffusion of hydrogen and oxygen from the first inorganic layer IL21 and the second inorganic layer IL22 of the second insulating layer IL2 may be easily controlled. As described above, as the inorganic control layer LP has a lower density than the first inorganic layer IL21 and the second inorganic layer IL22, the inorganic control layer LP may collect hydrogen and oxygen diffused from the first inorganic layer IL21 and the second inorganic layer IL22. The inorganic control layer LP may absorb hydrogen diffused from the first inorganic layer IL21 in an upper portion, such as a silicon nitride layer, and absorb oxygen diffused from the second inorganic layer IL22 located in a lower portion, such as a silicon oxide layer.

As described above, as the inorganic control layer LP collects hydrogen and oxygen diffused from the first and second inorganic layers IL21 and IL22, diffusion of hydrogen and oxygen to the semiconductor layer A, such as to the source area SA and the drain area DA, may be prevented, thereby finely controlling device characteristics of the semiconductor layer A.

Figure 7:
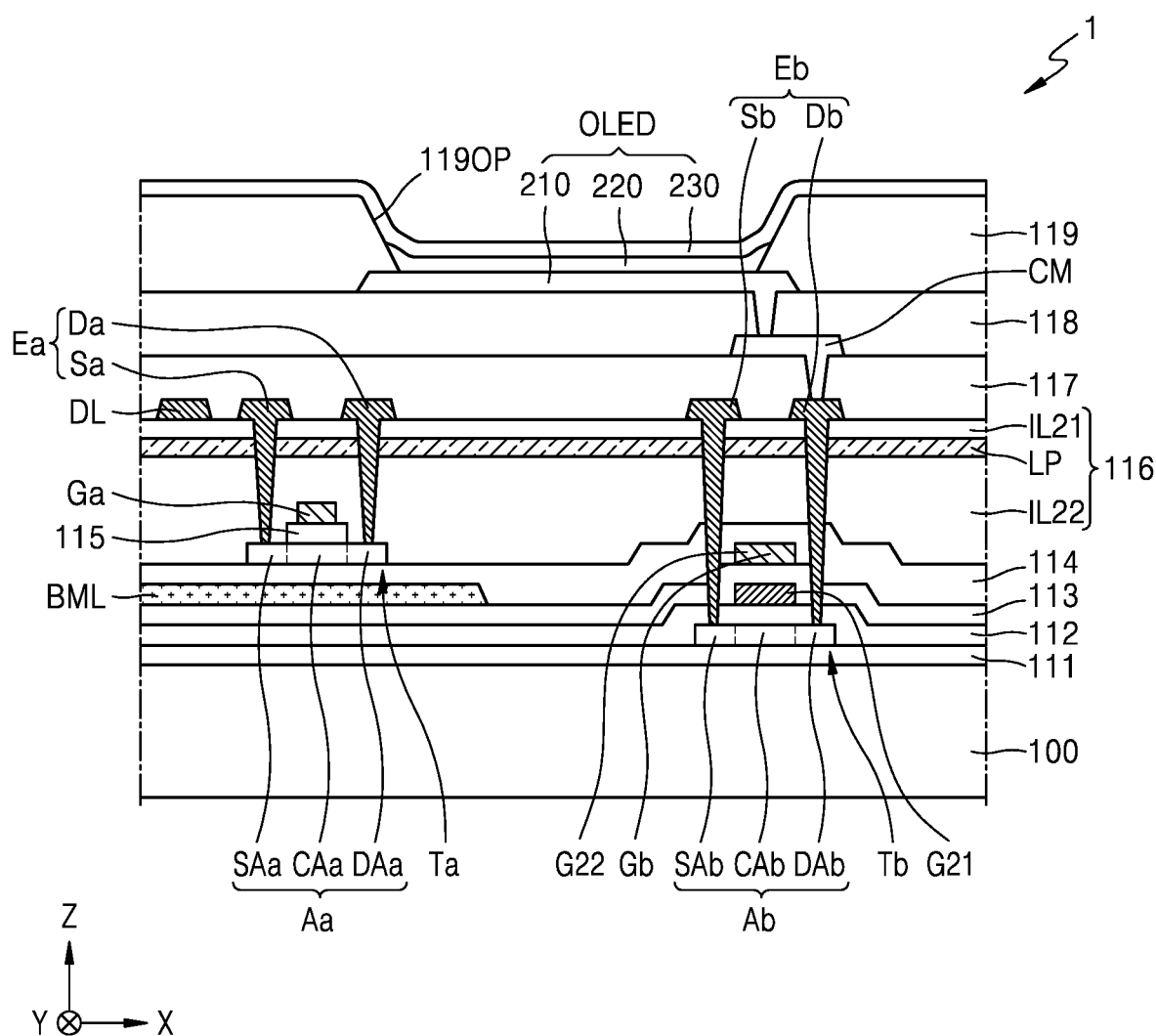
FIG. 7 is a cross-sectional view of a stacked structure of a pixel of a display apparatus, according to an exemplary embodiment of the present inventive concepts.

FIG. 7 is a schematic cross-sectional view of a stacked structure of a pixel of a display apparatus, according to an exemplary embodiment.

Referring to FIG. 7, a substrate 100 may include glass or a polymer resin. In an exemplary embodiment, the polymer resin may be polyethersulphone, polyacrylate, polyetherimide, polyethylene naphthalate, polyethylene terephthalate, polyphenylene sulfide, polyarylate, polyimide, polycarbonate, cellulose triacetate, cellulose acetate propionate, etc. However, exemplary embodiments of the present inventive concepts are not limited thereto. In an exemplary embodiment, the substrate 100 may include a polymer resin and the substrate may be flexible, rollable or bendable. The substrate 100 may include a multi-layer structure including the layer including a polymer resin described above and an inorganic layer.

A buffer layer 111 may be located on the substrate 100 to reduce or prevent penetration of foreign substances, moisture, or external air from below the substrate 100 and may also provide a planar surface on the substrate 100. In an exemplary embodiment, the buffer layer 111 may include an inorganic material such as an oxide or a nitride, an organic material, or an organic-inorganic complex material. The buffer layer 111 may have a single-layer or multi-layer structure including an organic material and an organic material. A barrier layer that blocks penetration of extern lair may be further included between the substrate 100 and the buffer layer 111.

A first thin film transistor Ta and a second thin film transistor Tb may be located above the substrate 100. For example, as shown in the exemplary embodiment of FIG. 7, the first thin film transistor Ta and the second thin film transistor Tb may be arranged in the X direction. The first thin film transistor Ta may include a first semiconductor layer Aa including an oxide semiconductor material, a first gate electrode Ga, and a first electrode layer Ea. The second thin film transistor Tb may include a second semiconductor layer Ab including low-temperature poly-silicon (LTPS), a second gate electrode Gb, and a second electrode layer Eb. According to an exemplary embodiment, as illustrated in FIG. 7, the first thin film transistor Ta may function as a switching thin film transistor and the second thin film transistor Tb may function as a driving thin film transistor. The thin film transistor T of FIGS. 4 through 6 described above may be included as the first thin film transistor Ta of FIG. 7.

The second semiconductor layer Ab of the second thin film transistor Tb may be arranged above the buffer layer 111. According to an exemplary embodiment, the second semiconductor layer Ab may include LTPS. A poly-silicon material has a high electron mobility (100 $cm^2$/Vs or higher) and thus has low energy power consumption and a high reliability, and thus, may be used as a semiconductor layer of a thin film transistor in a display apparatus. In addition, the second semiconductor layer Ab is not limited to including LTPS, and exemplary embodiments of the present inventive concepts may also include amorphous silicon (a-Si) and/or an oxide semiconductor. For example, some semiconductor layers of a plurality of thin film transistors may be formed of LTPS, and other semiconductor layers thereof may be formed of amorphous silicon (a-Si) and/or an oxide semiconductor.

The second gate electrode Gb is arranged on the second semiconductor layer Ab to overlap a second channel area CAb of the second semiconductor layer Ab. The second gate electrode Gb may include a lower gate electrode G21 and an upper gate electrode G22 stacked to overlap each other (e.g., in the Z direction). In an exemplary embodiment, the lower gate electrode G21 and the upper gate electrode G22 may include molybdenum (Mo), aluminum (Al), copper (Cu), titanium (Ti), etc., and may have a single-layer or multi-layer structure. According to an exemplary embodiment, the lower gate electrode G21 and the upper gate electrode G22 may each be a single layer including Mo. However, exemplary embodiments of the present inventive concepts are not limited thereto.

The lower gate electrode G21 is arranged above the second semiconductor layer Ab with a first gate insulating layer 112 therebetween. For example as shown in the exemplary embodiment of FIG. 7, a bottom surface of the lower gate electrode G21 is disposed directly on the top surface of the first gate insulating layer 112 (e.g., in the Z direction). The upper gate electrode G22 is arranged above the lower gate electrode G21 with a second gate insulating layer 113 therebetween. For example as shown in the exemplary embodiment of FIG. 7, a bottom surface of the upper gate electrode G22 is disposed directly on the top surface of the second gate insulating layer 113 (e.g., in the Z direction). In an exemplary embodiment, the first and second gate insulating layers 112 and 113 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$), etc. However, exemplary embodiments of the present inventive concepts are not limited thereto.

A first interlayer insulating layer 114 may be included to cover the upper gate electrode G22, and a second interlayer insulating layer 116 may be provided above the first interlayer insulating layer 114. For example as shown in the exemplary embodiment of FIG. 7, a bottom surface of the second interlayer insulating layer 116 may be disposed directly on the top surface of the first interlayer insulating layer 114 (e.g., in the Z direction). In an exemplary embodiment, the first and second interlayer insulating layers 114 and 116 may include silicon oxide (SiO$_x$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$), etc. However, exemplary embodiments of the present inventive concepts are not limited thereto.

In FIG. 7, some or all of the buffer layer 111, the first gate insulating layer 112, the second gate insulating layer 113, and the first interlayer insulating layer 114 may correspond to the first insulating layer IL1 of FIGS. 4 through 6 described above.

The second electrode layer Eb may be arranged on the second interlayer insulating layer 116. For example, a bottom surface of the second electrode layer Eb may be disposed directly on a top surface of the second interlayer insulating layer (e.g., in the Z direction). The second electrode layer Eb may be electrically connected to the second semiconductor layer Ab via a contact hole defined in the second interlayer insulating layer 116, the first interlayer insulating layer 114, the second gate insulating layer 113, and the first gate insulating layer 112. The second electrode layer Eb may include a second source electrode Sb electrically connected to a second source area SAb of the second semiconductor layer Ab and a second drain electrode Db electrically connected to a second drain area DAb of the second semiconductor layer Ab. The second electrode layer Eb may be connected to the data line DL, the driving voltage line PL, etc. In an exemplary embodiment, the second electrode layer Eb may include a conductive material including, for example, molybdenum (Mo), aluminum (Al), copper (Cu) titanium (Ti), etc. and may include a multi-layer or a single layer including the above-described material. According to an exemplary embodiment, the second electrode layer Eb may include a multi-layer structure including Ti/Al/Ti. However, exemplary embodiments of the present inventive concepts are not limited thereto.

The contact metal CM is arranged with a first planarization layer 117 therebetween. For example, as shown in the exemplary embodiment of FIG. 7, a bottom surface of the first planarization layer 117 is disposed directly on a top surface of the second electrode layer Eb and the first inorganic layer IL21 (e.g., in the Z direction) and a bottom surface of the contact metal is disposed on a top surface of the first planarization layer e.g., in the Z direction). A second planarization layer 118 may cover the contact metal CM and be disposed directly on a top surface of the first planarization layer 117 (e.g., in the Z direction). The pixel electrode 210 and the second thin film transistor Tb may be electrically connected to each other via a contact hole defined in a second planarization layer 118 covering the contact metal CM. The first planarization layer 117 and the second planarization layer 118 may have a planar top surface such that the pixel electrode 210 is formed planarly. The first and second planarization layers 117 and 118 may include a layer formed of an organic material and having a single-layer or multi-layer structure. For example, the first and second planarization layers 117 and 118 may include general-purpose polymers such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide polymer, an aryl ether polymer, an amide polymer, a fluorine polymer, a p-xylene polymer, a vinyl alcohol polymer, and blends thereof. However, exemplary embodiments of the present inventive concepts are not limited thereto.

According to another exemplary embodiment, the first and second planarization layers 117 and 118 may include an inorganic material. For example, the first and second planarization layers 117 and 118 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZnO$_2$), etc. When the first and second planarization layers 117 and 118 include an inorganic material, chemical planarization polishing may be performed as required. The first and second planarization layers 117 and 118 may include both an organic material and an inorganic material.

The pixel electrode 210 may be a (semi)transmissive electrode or a reflective electrode. In some exemplary embodiments, the pixel electrode 210 may include a reflective layer formed of Ag, Mg, Al, Pt, Pd, Au, Ni, Nd, Ir, Cr, or a compound thereof and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide (In$_2$O$_3$), indium gallium oxide (IGO), and aluminum zinc oxide (AZO). In some exemplary embodiments, the pixel electrode 210 may have a stacked structure including ITO/Ag/ITO. However, exemplary embodiments of the present inventive concepts are not limited thereto.

A pixel defining layer 119 may be arranged above the second planarization layer 118. For example, as shown in the exemplary embodiment of FIG. 7, a bottom surface of the pixel defining layer 119 may be disposed directly on a top surface of the planarization layer (e.g., in the Z direction). The pixel defining layer 119 may include an opening 119OP exposing a central portion of the pixel electrode 210, thereby defining an emission area of pixels. As shown in the exemplary embodiment of FIG. 7, an intermediate layer 220 may be disposed directly on the pixel electrode (e.g., in the Z direction). An opposite electrode 230 may be disposed directly on the intermediate electrode 220 (e.g., in the Z direction). The pixel defining layer 119 may increase a distance (e.g., in the Z direction) between an edge of the pixel electrode 210 and an opposite electrode 230 over the pixel electrode 210 to prevent an arc or the like at the edge of the pixel electrode 210. In an exemplary embodiment, the pixel defining layer 119 may be formed using an organic insulating material such as polyimide, polyamide, acrylic resin, BCB, HMDSO, and phenolic resin and by using a method such as spin coating. However, exemplary embodiments of the present inventive concepts are not limited thereto.

The intermediate layer 220 of the organic light-emitting diode OLED may include an organic emission layer. The organic emission layer may include an organic material that includes a fluorescent or phosphorescent material that emits red, green, blue, or white light. For example, the organic emission layer may include a low molecular-weight organic material or a polymer organic material, and functional layers such as a hole transport layer (HTL), a hole injection layer (HIL), an electron transport layer (ETL), an electron injection layer (EIL), or the like may be selectively further arranged under and over the organic emission layer. A plurality of pixel electrodes 210 may be included, and the intermediate layer 220 may be arranged to correspond to each of the plurality of pixel electrodes 210. However, exemplary embodiments of the present inventive concepts are not limited thereto. The intermediate layer 220 may include a layer that is formed as a single body over the plurality of pixel electrodes 210 or other various modifications may also be made thereto.

The opposite electrode 230 may be a transmissive electrode or a reflective electrode. In some exemplary embodiments, the opposite electrode 230 may be a transparent or semi-transparent electrode and may include a metal thin film including Ca, LiF/Ca, LiF/Al, Al, Ag, Mg or a compound thereof and having a small work function. In addition, a transparent conductive oxide (TCO) layer such as ITO, IZO, ZnO or $In_2O_3$ may be further arranged on the metal thin film. The opposite electrode 230 may be arranged over the display area DA and the non-display area NDA and on the intermediate layer 220 and the pixel defining layer 119. The opposite electrode 230 may be formed as a single body and may extend over the substrate 100 (e.g., in the X direction) to a plurality of organic light-emitting diodes OLED and correspond to the plurality of pixel electrodes 210.

In an embodiment in which the pixel electrode 210 includes a reflective electrode and the opposite electrode 230 includes a transmissive electrode, light from the intermediate layer 220 is emitted toward the opposite electrode 230 and the display apparatus may be a top emission type. In an embodiment in which the pixel electrode 210 includes a transparent or semi-transparent electrode and the opposite electrode 230 includes a reflective electrode, light from the intermediate layer 220 is emitted toward the substrate 100 and the display apparatus may be a bottom emission type. However, the exemplary embodiments are not limited thereto. For example, the display apparatus according to the present exemplary embodiment may also be a dual emission type in which light is emitted toward two directions, such as the top and bottom sides of the display apparatus.

A light-blocking layer BML may be arranged apart from the second Rate electrode Gb. According to the exemplary embodiment of FIG. 7, the light-blocking layer BML may be arranged on the second gate insulating layer 113 and include a same material as the material of the upper gate electrode G22. For example, the light-blocking layer BML may be disposed directly on the second gate insulating layer 113 (e.g., in the Z direction). According to another exemplary embodiment, the light-blocking layer BML may be arranged on the first gate insulating layer 112 (e.g., disposed directly on the first gate insulating layer in the Z direction) and include a same material as the material of the lower gate electrode G21.

The light-blocking layer BML may be arranged to overlap the first semiconductor layer Aa including an oxide semiconductor material. For example, as shown in the exemplary embodiment of FIG. 7, a bottom surface of the light-blocking layer BML may be disposed directly on a top surface of the second gate insulating layer 113 (e.g., in the Z direction). A bottom surface of the first interlayer insulating layer 114 is disposed on atop surface of the light-blocking layer BML (e.g., in the Z direction). The first semiconductor layer Aa including an oxide semiconductor material is vulnerable to light. Therefore, the light-blocking layer BML may prevent deformation of device characteristics of the first thin film transistor Ta including an oxide semiconductor material due to a photocurrent generated in the first semiconductor layer Aa by external light incident from the substrate 100.

The first semiconductor layer Aa may be disposed above the light-blocking layer BML with the first interlayer insulating layer 114 therebetween. The first semiconductor layer Aa of the first thin film transistor Ta may include an oxide semiconductor material. In an exemplary embodiment, the first semiconductor layer Aa may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the first semiconductor layer Aa may be an InSnZnO (ITZO) semiconductor layer, an InGaZnO (IGZO) semiconductor layer, or the like. However, exemplary embodiments of the present inventive concepts are not limited thereto. An oxide semiconductor has a broad bandgap (of about 3.1 eV), high carrier mobility, and low leakage current. Therefore, even when a driving time period is long, the voltage drop is relatively minor and variation in luminance in an oxide semiconductor due to the voltage drop even at low-frequency driving is relatively minor.

A third gate insulating layer 115 may be located above a first channel area CAa of the first semiconductor layer Aa. For example, as shown in the exemplary embodiment of FIG. 7, a bottom surface of a third gate insulating layer 115 may be disposed directly on a top surface of the first channel area CAa (e.g., in the Z direction). A top surface of the third gate insulating layer may be disposed directly on a bottom surface of the first gate electrode Ga (e.g., in the Z direction). The third gate insulating layer 115 of FIG. 7 may correspond to the gate insulating layer GI of FIGS. 4 through 6 described above. The third gate insulating layer 115 is patterned to overlap a portion of the first semiconductor layer Aa (e.g., in the Z direction). An overlapping area between the third gate insulating layer 115 and the first semiconductor layer Aa may be the channel area CAa. For example, the channel area CAa that is not doped with impurities may be formed at a position overlapping the third gate insulating layer 115, and a source area SAa and a drain area DAs that are doped with impurities may be formed at both sides of the channel area CAa (e.g., in the X direction).

A first gate electrode Ga may be disposed on the third gate insulating layer 115. The first gate electrode Ga, of FIG. 7 is illustrated as having a smaller width (e.g., length in the X direction) than the third gate insulating layer 115 that is patterned. However, in another exemplary embodiment, the first gate electrode Ga may have an equal width to that of the third gate insulating layer 115.

A first electrode layer Ea may be arranged above the first gate electrode Ga with the second interlayer insulating layer 116 therebetween. The first electrode layer Ea may include a first source electrode Sa electrically connected to the first source area SAa and a first drain electrode Da electrically connected to the first drain area DAa via contact holes extending through the second interlayer insulating layer 116. According to an exemplary embodiment, the first electrode layer Ea may be a single layer including Mo or a multi-layer including Mo/Al/Mo. The first electrode layer Ea may be connected to the data line DL and/or the driving voltage line PL.

The second interlayer insulating layer 116 may be disposed between the gate electrode G and the electrode layer E. The second interlayer insulating layer 146 of FIG. 7 may correspond to the second insulating layer IL2 of FIGS. 4 through 6 described above. However, exemplary embodiments of the present inventive concepts are not limited thereto.

In the exemplary embodiment shown in FIG. 7, the second interlayer insulating layer 116 may have a multi-layer structure. The second interlayer insulating layer 116 may include a first inorganic layer IL21, a second inorganic layer IL22, and an inorganic control layer LP between the first inorganic layer IL21 and the second inorganic layer IL22. For example, as shown in the exemplary embodiment of FIG. 7, a bottom surface, of the second inorganic layer IL22 is disposed directly on a top surface of the first interlayer insulating layer 114 (e.g., in the Z direction). A top surface of the second inorganic layer IL22 is disposed directly on a bottom surface of the inorganic control layer LP (e.g., in the Z direction). A top surface of the inorganic control layer LP is disposed directly on a bottom surface of the first inorganic layer IL21. In an exemplary embodiment, the first inorganic layer IL21, the second inorganic layer IL22, and the inorganic control layer LP may each include a single layer or multi-layer including silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc. According to an exemplary embodiment, the first inorganic layer IL21 in an upper portion may include silicon nitride ($SiN_x$), and the second inorganic layer IL22 in a lower portion may include silicon oxide ($SiO_x$). In other exemplary embodiments, the second interlayer insulating layer 116 may also have the structure of FIG. 5 or FIG. 6 described above.

The inorganic control layer LP may have a lower density than the first inorganic layer IL21 and the second inorganic layer IL22. For example, the first inorganic layer IL12, the second inorganic layer IL22, and the inorganic control layer LP may be formed using a PECVD method, and a layer formation density of the inorganic control layer LP may be controlled by adjusting power (RF power) for generating plasma as described above with reference to FIG. 4.

Since the inorganic control layer LP has a lower density than the first inorganic layer IL21 and the second inorganic layer IL22, the inorganic control layer LP may collect hydrogen and oxygen diffused from the first inorganic layer IL21 and the second inorganic layer IL22. Accordingly, diffusion of hydrogen and oxygen to the first semiconductor layer Aa, such as the first source area SA and the first drain area DAa may be prevented by the collection of hydrogen and oxygen by the inorganic control layer LP thereby finely controlling device characteristics of the first semiconductor layer Aa.

Figure 8:
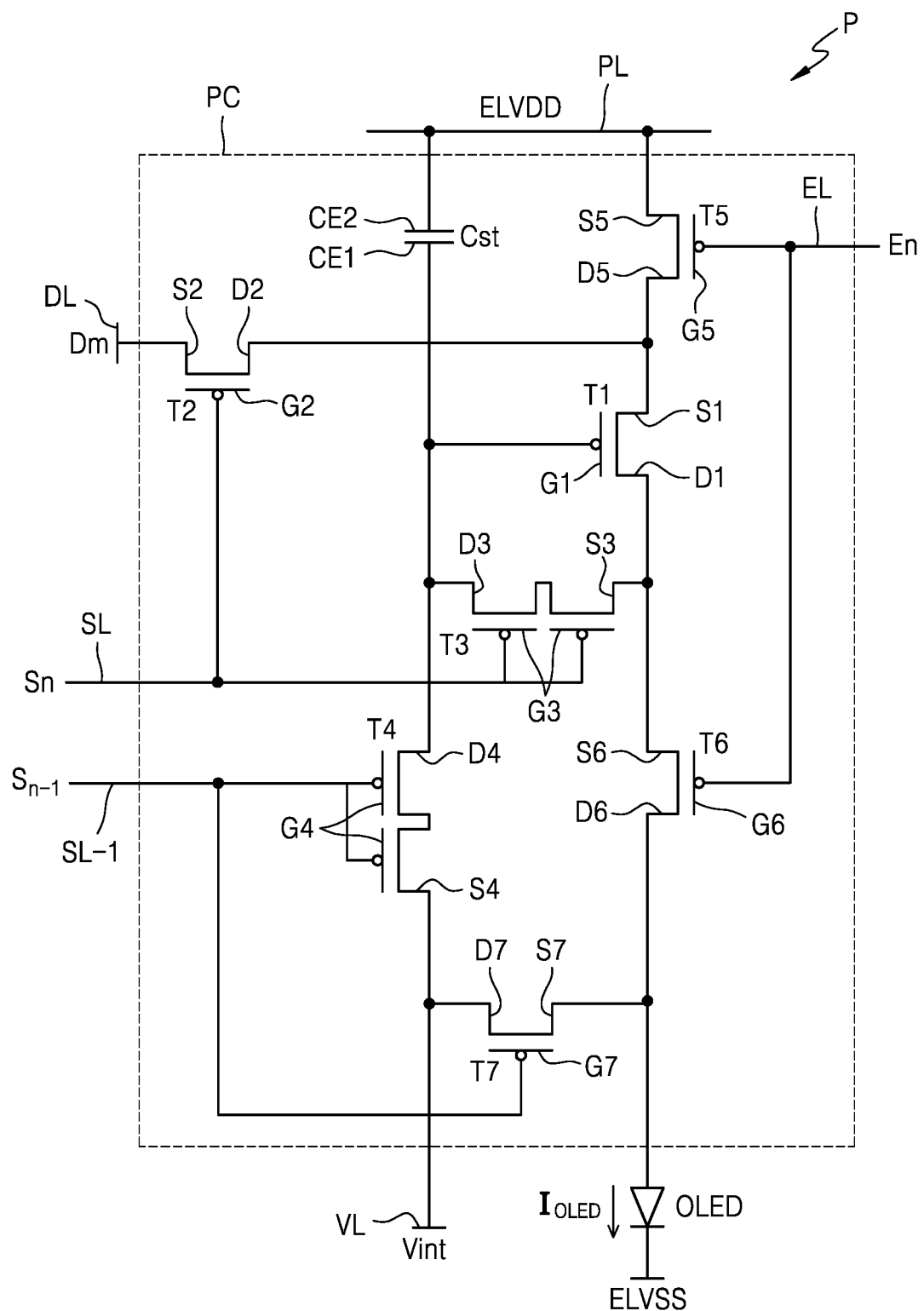
FIG. 8 is an equivalent circuit diagram of a pixel that may be included in a display apparatus, according to an exemplary embodiment of the present inventive concepts.
Figure 9:
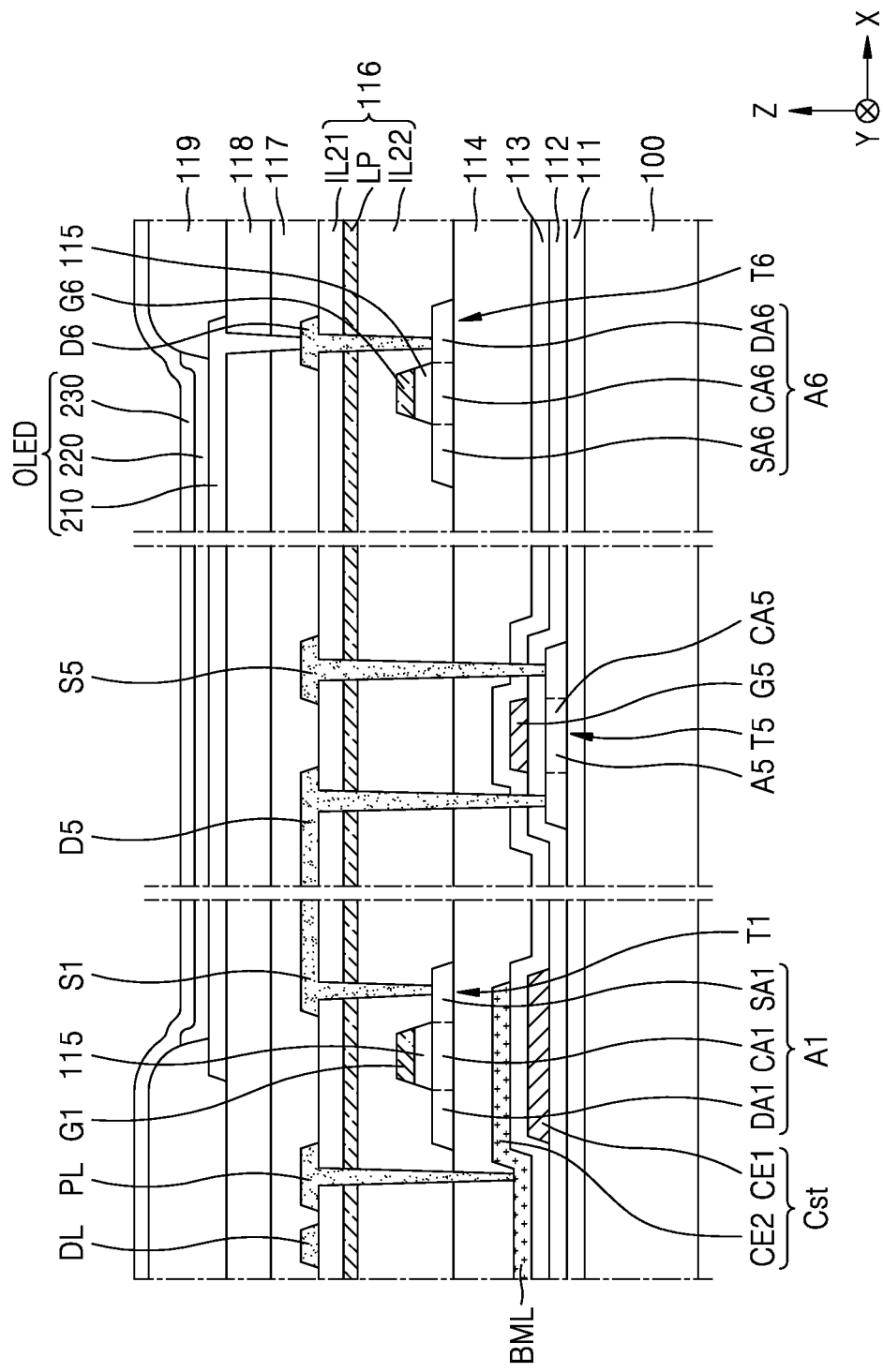
FIG. 9 is a cross-sectional view of a stacked structure of a pixel that may be included in a display apparatus, according to an exemplary embodiment of the present inventive concepts.

FIG. 8 is an equivalent circuit diagram of a pixel of a display apparatus, according to an exemplary embodiment. FIG. 9 is a cross-sectional view of a stacked structure of a pixel that may be included in a display apparatus, according to an exemplary embodiment.

Referring to FIG. 8, the pixel P includes a pixel circuit PC and an organic light-emitting diode OLED connected to the pixel circuit PC. The pixel circuit PC may include a plurality of thin film transistors and a storage capacitor. The thin film transistors and the storage capacitor may be connected to signal line, such as a scan line SL, previous scan line SL−1, an emission control line EL, and a data line DL, and an initialization voltage line VL, and a driving voltage line PL.

While the pixel P is illustrated in FIG. 8 to be connected to the signal lines, the initialization voltage line VL, and the driving voltage line PL, exemplary embodiments of the present inventive concepts are not limited thereto. According to another exemplary embodiment, at least one of the signal lines and the initialization voltage line VL, and the driving voltage line PL, or the like may be shared between neighboring pixels.

The plurality of thin film transistors may include a first thin film transistor T1, a second thin film transistor T2, a third thin film transistor T3, a fourth thin film transistor T4, a fifth thin film transistor T5, a sixth thin film transistor T6, and a seventh thin film transistor T7. In an exemplary embodiment, these thin film transistors may be respectively defined as a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines include a scan line SL via which a scan signal Sn is transferred, a previous scan line SL−1 via which a previous scan signal Sn−1 is transferred to the first initialization thin film transistor T4 and the second initialization thin film transistor T7, an emission control line EL via which an emission control signal En is transferred to the operation control thin film transistor T5 and the emission control thin film transistor T6, and a data line DL which crosses the scan line SL and via which a data signal Dm is transferred. The driving voltage line PL transfers a driving voltage ELVDD to the driving thin film transistor T1, and the initialization voltage line VL transfers an initialization voltage Vint that initializes the driving thin film transistor T1 and a pixel electrode.

A driving gate electrode G1 of the driving thin film transistor T1 is connected to a lower electrode CE1 of a storage capacitor Cst. A driving source electrode S1 of the driving thin film transistor T1 passes by the operation control thin film transistor T5 and is connected to the driving voltage line PL therebelow. A driving drain electrode D1 of the driving thin film transistor T1 passes by the emission control thin film transistor T6 and is electrically connected to a pixel electrode of a main organic light-emitting device OLED. The driving thin film transistor T1 receive s a data signal Dm according to a switching operation of the switching thin film transistor T2 to supply a driving current $I_{OLED}$ to the main organic light-emitting device OLED.

A switching gate electrode G2 of the switching thin film transistor T2 is connected to the scan line SL. A switching source electrode S2 of the switching thin film transistor T2 is connected to the data line DL. A switching drain electrode D2 of the switching thin film transistor T2 is connected to the driving source electrode S1 of the driving thin film transistor T1 and passes by the operation control thin film transistor T5 to be connected to the driving voltage line PL therebelow. The switching thin film transistor T2 is turned on according to a scan signal Sn received via the scan line SL to perform a switching operation of transferring the data signal Dm transferred to the data line DL, to the driving source electrode S1 of the driving thin film transistor T1.

A compensation gate electrode G3 of the compensation thin film transistor T3 is connected to the scan line SL. A compensation source electrode S3 of the compensation thin film transistor T3 is connected to the driving drain electrode D1 of the driving thin film transistor T1 and passes by the emission control thin film transistor T6 to be connected to the pixel electrode of the organic light-emitting device OLED. A compensation drain electrode D3 of the compensation thin film transistor T3 is connected to the lower electrode CE1 of the storage capacitor Cst, the first initialization drain electrode D4 of the first initialization thin film transistor T4, and the driving gate electrode G1 of the driving thin film transistor T1. The compensation thin film transistor T3 is turned on according to a scan signal Sn received via the scan line SL to electrically connect the driving gate electrode G1 to the driving drain electrode D1 of the driving thin film transistor T1, thereby diode-connecting the driving thin film transistor T1.

A first initialization gate electrode G4 of the first initialization thin film transistor T4 is connected to the previous scan line SL−1. A first initialization source electrode S4 of the first initialization thin film transistor T4 is connected to a second initialization drain electrode D7 of the second initialization thin film transistor T7 and the initialization voltage line VL. A first initialization drain electrode D4 of the first initialization thin film transistor T4 is connected to the lower electrode CE1 of the storage capacitor Cst, the compensation drain electrode D3 of the compensation thin film transistor T3, and the driving gate electrode G1 of the driving thin film transistor T1. The first initialization thin film transistor T4 is turned on according to the previous signal Sn−1 received via the previous scan line SL−1 to perform an initialization operation of transferring an initialization voltage Vint to the driving gate electrode D1 of the driving thin film transistor T1 and initializing a voltage of the driving gate electrode G1 of the driving thin film transistor T1.

An operation control gate electrode G5 of the operation control thin film transistor T5 is connected to the emission control line EL. An operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL. An emission control source electrode S6 of the emission control thin film transistor T6 is connected to the driving drain electrode D1 of the driving thin film transistor T1 and the compensation source electrode S3 of the compensation thin film transistor T3. An emission control drain electrode D6 of the emission control thin film transistor T6 is connected to the second initialization source electrode S7 of the second initialization thin film transistor T7 and the pixel electrode of the organic light-emitting device OLED.

The operation control thin film transistor T5 and the emission control thin film transistor T6 are simultaneously turned on according to an emission control signal En received via the emission control line EL such that a driving voltage ELVDD is transferred to the main organic light-emitting device OLED. Therefore, a driving current $I_{OLED}$ flows through the organic light-emitting device OLED.

A second initialization gate electrode G7 of the second initialization thin film transistor T7 is connected to the previous scan line SL−1. A second initialization source electrode 87 of the second initialization thin film transistor T7 is connected to the emission control drain electrode D6 of the emission control thin film transistor T6 and the pixel electrode of the organic light-emitting device OLED. The second initialization drain electrode D7 of the second initialization thin film transistor T7 is connected to the first initialization source electrode S4 of the first initialization thin film transistor T4 and the initialization voltage line VL. The second initialization thin film transistor T7 is turned on according to the previous scan signal Sn−1 received via the previous scan line SL−1 to initialize the pixel electrode of the organic light-emitting device OLED.

In FIG. 8, the first initialization thin film transistor T4 and the second initialization thin film transistor T7 are connected to the previous scan line SL−1. However, exemplary embodiments of the present inventive concepts are not limited thereto. According to another exemplary embodiment, the first initialization thin film transistor T4 may be connected to the previous scan line SL−1 to be driven according to the previous scan signal Sn−1, and the second initialization thin film transistor T7 may be connected to an additional signal line (e.g., a subsequent scan line) to be driven according to a signal received via the additional signal line.

An upper electrode CE2 of the storage capacitor Cst is connected to the driving voltage line PL, and an opposite electrode of the organic light-emitting device OLED is connected to a common voltage ELVSS. Accordingly, the organic light-emitting device OLED may emit light by receiving a driving current $I_{OLED}$ from the driving thin film transistor T1, thereby displaying an image.

In the exemplary embodiment shown in FIG. 8, the compensation thin film transistor T3 and the first initialization thin film transistor T4 each have a dual gate electrode. However, in other exemplary embodiments, the compensation thin film transistor T3 and/or the first initialization thin film transistor T4 may include one gate electrode.

According to an exemplary embodiment, the driving thin film transistor T1, the switching thin film transistor T2, the compensation thin film transistor T3, the first initialization thin film transistor T4, and the second initialization thin film transistor T7 of a pixel P may include an oxide semiconductor. In addition, the operation control thin Film transistor T5 and the emission control thin film transistor T6 of the pixel P may include an LTPS semiconductor.

According to another exemplary embodiment, the driving thin film transistor T1 of the pixel P may include an oxide semiconductor, and the remaining thin film transistors (e.g., the switching thin film transistor T2, the compensation thin film transistor T3, the first initialization thin film transistor T4, the operation control thin film transistor T5, the emission control thin film transistor T6, and the second initialization thin film transistor T7) may include an LTPS semiconductor.

According to another exemplary embodiment the driving thin film transistor T1, the switching thin film transistor T2, the compensation thin film transistor T3, the first initialization thin film transistor T4, the emission control thin film transistor T6, and the second initialization thin film transistor T7 (e.g., all of the thin film transistors except for the operation control thin film transistor T5) of a pixel P may include an oxide semiconductor, and the operation control thin film transistor T5 may include a LTPS semiconductor.

Oxide semiconductor layers of the driving thin film transistor T1, the switching thin film transistor T2, the compensation thin film transistor T3, the first initialization thin film transistor T4, and the second initialization thin film transistor T7 may be connected to each other (e.g., as a single body) to be bent in various shapes. An oxide semiconductor layer may include, for example, various metal oxides such as an indium-gallium-zinc oxide (IGZO).

Silicon semiconductor layers of the operation control thin film transistor T5 and the emission control thin film transistor T6 may be arranged on a same layer and include a same material. For example, the silicon semiconductor layer may include LTPS.

FIG. 9 shows an exemplary embodiment in which an operation control semiconductor layer A5 is formed of LTPS.

The operation control gate electrode G5 may be arranged above the operation control semiconductor layer A5 with the first gate insulating layer 112 therebetween. For example, as shown in the exemplary embodiment of FIG. 9, a bottom surface of the first gate insulating layer 112 is disposed directly on a top surface of the operation control semiconductor layer A5 (e.g., in the Z direction). A bottom surface of the operation control gate electrode G5 is disposed directly on a top surface of the first gate insulating layer 112 (e.g., in the Z direction).

In an exemplary embodiment, the lower electrode CE1 of the storage capacitor Cst may be arranged on a same layer (e.g., the first gate insulating layer 112) as the operation control gate electrode G5, and the lower electrode CE1 of the storage capacitor Cst and the operation control gate electrode G5 may include a same material. The operation control gate electrode G5 may include a double gate electrode like the second gate electrode Gb of FIG. 7.

The upper electrode CE2 of the storage capacitor Cst may be arranged above the lower electrode CE1 of the storage capacitor Cst with the second gate insulating layer 113 therebetween. For example, a bottom surface of the upper electrode CE2 of the storage capacitor Cst may be disposed directly on a top surface of the second gate insulating layer 113 (e.g., in the Z direction). The bottom surface of the second gate insulating layer 113 may be disposed directly on a top surface of the lower electrode CE1 of the storage capacitor Cst (e.g., in the Z direction).

The upper electrode CE2 of the storage capacitor Cst may be included as the light-blocking layer BML. The light-blocking layer BML may be arranged below (e.g., in the Z direction) the driving thin film transistor T1 to block external light incident to a driving semiconductor layer A1, thereby stabilizing device characteristics of a thin film transistor.

The driving semiconductor layer A1 of the driving thin film transistor T1 and the emission control semiconductor layer A6 of the operation control thin film transistor T6 may be arranged above (e.g., in the Z direction) the upper electrode CE2 of the storage capacitor Cst with the first interlayer insulating layer 114 therebetween. In an exemplary embodiment, the driving semiconductor layer A1 and the emission control semiconductor layer A6 may include an oxide semiconductor material.

The third gate insulating layer 115 that is patterned to correspond to a driving channel area CA1 and an emission control channel area CA6 may be disposed on the driving semiconductor layer A1 and an emission control semiconductor layer A6. The driving gate electrode G1 and emission control gate electrode G6 may be respectively disposed on the patterned third gate insulating layer 115.

The second interlayer insulating layer 116 may be arranged on the driving gate electrode G1 and the emission control gate electrode G6. In the driving thin film transistor T1, the second interlayer insulating layer 116 may be included to cover the driving gate electrode G1, a driving source area SA1 and a driving drain area DA1. The second interlayer insulating layer 116 may be understood to be the second insulating layer IL2 of FIGS. 4 through 6 described above.

The second interlayer insulating layer 116 may include the first inorganic layer IL21, the second inorganic layer IL22, and the inorganic control layer LP between the first inorganic layer IL21 and the second inorganic layer IL22. The inorganic control layer LP may have a lower density than the first inorganic layer IL21 and the second inorganic layer IL22. Since the inorganic, control layer LP has a lower density than the first inorganic layer IL21 and the second inorganic layer IL22, the inorganic control layer LP may collect hydrogen and oxygen diffused from the first inorganic layer IL21 and the second inorganic layer IL22. As described above, as the inorganic control layer LP collects hydrogen and oxygen diffused from the first and second inorganic layers IL21 and IL22. Therefore, diffusion of hydrogen and oxygen to the driving semiconductor layer A1 formed of an oxide semiconductor material may be prevented, thereby finely controlling device characteristics of the driving semiconductor layer A1. Likewise, diffusion of hydrogen and oxygen to the emission control semiconductor layer A6 may be prevented, thereby finely controlling device characteristics of the emission control semiconductor layer.

A conductive layer(s) may be arranged on the second interlayer insulating layer 116. The conductive layer(s) may include a source electrode and/or a drain electrode of each thin film transistor and include the data line DL and the driving voltage line PL. The structures on the conductive layer(s) described above are identical to those of FIG. 7, and repeated description thereof will be omitted.

The driving source electrode S1 electrically connected to the driving semiconductor layer A1, the operation control source electrode S5 and the operation control drain electrode D5 electrically connected to the operation control semiconductor layer A5, and the emission control drain electrode D6 electrically connected to the emission control semiconductor layer A6 may be located on the second interlayer insulating layer 116. According to an exemplary embodiment, the driving source electrode S1 and the operation control drain electrode D5 may be connected to each other. In addition, the data line DL and the driving voltage line PL may be located above the second interlayer insulating layer 116. Although not illustrated in the drawings, according to an exemplary embodiment, the operation control source electrode S5 may be directly connected to the driving voltage line PL.

According to the exemplary embodiments as described above, a thin film transistor substrate in which characteristics of a circuit including a thin film transistor are improved, and a display apparatus including the thin film transistor substrate may be implemented. However, the scope of the present disclosure is not limited by the above-described effects.

It should be understood that exemplary embodiments described herein should be considered in a descriptive sense only and not for purposes of limitation. Descriptions of features or aspects within each embodiment should typically be considered as available for other similar features or aspects in other embodiments. While one or more exemplary embodiments have been described with reference to the figures, it will be understood by those of ordinary skill in the art that various changes in form and details may be made therein without departing from the spirit and scope as defined by the following claims.

What is claimed is:
1. A thin film transistor substrate comprising:
a first semiconductor layer disposed on a substrate and comprising a first channel area, a first source area and a first drain area, the first semiconductor layer comprising an oxide semiconductor material;
a first gate electrode disposed above the first semiconductor layer and overlapping the first channel area;

a first electrode layer disposed above the first gate electrode and electrically connected to at least one of the first source area and the first drain area; and a second insulating layer disposed between the first gate electrode and the first electrode layer, the second insulating layer including an inorganic control layer and a first inorganic layer arranged on the inorganic control layer, wherein the inorganic control layer has a lower density than a density of the first inorganic layer.

2. The thin film transistor substrate of claim 1, further comprising:

a gate insulating layer disposed between the first semiconductor layer and the first gate electrode, wherein the gate insulating layer is patterned to correspond to the first channel area.

3. The thin film transistor substrate of claim 2, wherein:

the gate insulating layer overlaps the first channel area and exposes the first source area and the first drain area; and the second insulating layer directly contacts the first source area and the first drain area.

4. The thin film transistor substrate of claim 1, further comprising:

a second semiconductor layer disposed on the substrate;

a second gate electrode overlapping the second semiconductor layer; and a second electrode layer disposed above the second gate electrode and electrically connected to the second semiconductor layer, wherein the second semiconductor layer comprises low-temperature poly-silicon (LTPS).

5. The thin film transistor substrate of claim 4, wherein the second gate electrode comprises a lower gate electrode and an upper gate electrode that are spaced apart from each other.

6. The thin film transistor substrate of claim 4, further comprising a light-blocking layer disposed between the substrate and the first semiconductor layer.

7. The thin film transistor substrate of claim 6, wherein the light-blocking layer comprises a same material as a material of the second gate electrode.

8. The thin film transistor substrate of claim 6, further comprising:

a first insulating layer is disposed on the substrate between the first semiconductor layer and the substrate; and wherein the first insulating layer is disposed between the light-blocking layer and the first semiconductor layer.

9. The thin film transistor substrate of claim 6, further comprising:

a first insulating layer is disposed on the substrate between the first semiconductor layer and the substrate, wherein the first insulating layer and the second insulating layer are disposed between the second gate electrode and the second electrode layer.

10. The thin film transistor substrate of claim 1, wherein:

the first inorganic layer comprises silicon oxynitride; and the inorganic control layer comprises an inorganic material having a higher oxygen ratio and a lower nitrogen ratio than the first inorganic layer.

11. The thin film transistor substrate of claim 10, wherein the inorganic control layer comprises silicon oxynitride or silicon oxide.

12. A thin film transistor substrate comprising:

a first semiconductor layer disposed on a substrate and comprising a first channel area, a first source area and a first drain area;

a first gate electrode disposed above the first semiconductor layer and overlapping the first channel area;

a first electrode layer disposed above the first gate electrode and electrically connected to at least one of the first source area and the first drain area;

a second insulating layer disposed between the first gate electrode and the first electrode layer, the second insulating layer including an inorganic control layer and a first inorganic layer arranged on the inorganic control layer, wherein the inorganic control layer has a lower density than a density of the first inorganic layer; and a second inorganic layer disposed between the first semiconductor layer and the inorganic control layer, wherein the first inorganic layer comprises silicon nitride, and the second inorganic layer comprises silicon oxide.

13. The thin film transistor substrate of claim 12, wherein the inorganic control layer comprises at least one selected from the group consisting of silicon nitride, silicon oxide, and silicon oxynitride.

14. The thin film transistor substrate of claim 12, wherein:

the inorganic control layer comprises silicon oxide; and the inorganic control layer includes a higher concentration of hydrogen than the second organic layer.

15. The thin film transistor substrate of claim 12, wherein the inorganic control layer comprises silicon oxynitride.

16. A thin film transistor substrate, comprising:

a substrate;

a first thin film transistor disposed on the substrate and comprising a first semiconductor layer including an oxide semiconductor material, a first gate electrode overlapping the first semiconductor layer, and a first electrode layer disposed on the first gate electrode and electrically connected to the first semiconductor layer;

a second thin film transistor arranged on the substrate and comprising a second semiconductor layer including low-temperature poly-silicon (LTPS), a second gate electrode overlapping the second semiconductor layer, and a second electrode layer disposed on the second gate electrode and electrically connected to the second semiconductor layer; and an insulating layer disposed between the first gate electrode and the first electrode layer and comprising a first inorganic layer and an inorganic control layer, the inorganic control layer configured to absorb moisture diffused from the first inorganic layer.

17. The thin film transistor substrate of claim 16, further comprising:

a gate insulating layer disposed between the first semiconductor layer and the first gate electrode, wherein the gate insulating layer is patterned to correspond to a channel area of the first semiconductor layer.

18. The thin film transistor substrate of claim 16, further comprising:

a light-blocking layer disposed between the substrate and the first semiconductor layer, wherein the light-blocking layer comprises a same material as a material of the second gate electrode.

19. A display apparatus comprising:

a first semiconductor layer disposed on a substrate and comprising a first channel area, a first source area and a first drain area, the first semiconductor layer comprising an oxide semiconductor material;

a first gate electrode disposed above the first semiconductor layer and overlapping the first channel area;

a first electrode layer located above the first gate electrode and electrically connected to at least one of the first source area and the first drain area;

a second insulating layer disposed between the first gate electrode and the first electrode layer, the second insulating layer comprising an inorganic control layer and a first inorganic layer arranged on the inorganic control layer, wherein the inorganic control layer has a lower density than a density of the first inorganic layer; and a light-emitting device disposed above the second insulating layer and comprising a pixel electrode, an opposite electrode on the pixel electrode, and an intermediate layer disposed between the pixel electrode and the opposite electrode.

* * * * *